(12) United States Patent
Chioua et al.

(10) Patent No.: US 9,720,015 B2
(45) Date of Patent: Aug. 1, 2017

(54) INTELLIGENT VISUALIZATION IN THE MONITORING OF PROCESS AND/OR SYSTEM VARIABLES

(71) Applicant: ABB TECHNOLOGY AG, Zurich (CH)

(72) Inventors: Moncef Chioua, Heidelberg (DE); Martin Hollender, Dossenheim (DE)

(73) Assignee: ABB Schweiz AG, Baden (CH)

( * ) Notice: Subject to any disclaimer, the term of this patent is extended or adjusted under 35 U.S.C. 154(b) by 367 days.

(21) Appl. No.: 13/891,518

(22) Filed: May 10, 2013

(65) Prior Publication Data

US 2013/0253866 A1    Sep. 26, 2013

Related U.S. Application Data

(63) Continuation of application No. PCT/EP2011/004175, filed on Aug. 19, 2011.

(30) Foreign Application Priority Data

Nov. 13, 2010 (EP) .................................... 10014593

(51) Int. Cl.
  *G01R 13/00* (2006.01)
  *G05B 23/02* (2006.01)
(52) U.S. Cl.
  CPC ......... *G01R 13/00* (2013.01); *G05B 23/0216* (2013.01)

(58) Field of Classification Search
  CPC ...................................................... G01R 13/00
  See application file for complete search history.

(56) References Cited

U.S. PATENT DOCUMENTS

| | | | |
|---|---|---|---|
| 6,564,119 B1 | 5/2003 | Vaculic et al. | |
| 7,000,193 B1 * | 2/2006 | Impink et al. | 715/771 |
| 2006/0136175 A1 | 6/2006 | Suzuki et al. | |
| 2009/0177439 A1 | 7/2009 | Samples et al. | |

FOREIGN PATENT DOCUMENTS

WO    WO 2008/145154 A1    12/2008

OTHER PUBLICATIONS

International Search Report (PCT/ISA/210) issued on Nov. 2, 2011, by the European Patent Office as the International Searching Authority for International Application No. PCT/EP2011/004175.
European Search Report issued on Oct. 12, 2012.

* cited by examiner

*Primary Examiner* — Manuel Rivera Vargas
(74) *Attorney, Agent, or Firm* — Barnes & Thornburg LLP

(57) ABSTRACT

The disclosure relates to a method and system for intelligent visualization in the monitoring of process and/or system data used in technical processes and in the operation of technical systems. The behavior of signals in the past is analyzed and used for a future optimized visualization. Continuously running online algorithms support the system operator by detecting and correspondingly highlighting deviations from the historically observed signal patterns.

17 Claims, 4 Drawing Sheets

INTELLIGENT VISUALIZATION IN THE MONITORING OF PROCESS AND/OR SYSTEM VARIABLES

RELATED APPLICATION(S)

This application claims priority as a continuation application under 35 U.S.C. §120 to PCT/EP2011/004175, which was filed as an International Application on Aug. 19, 2011 designating the U.S., and which claims priority to European Application 10014593.7 filed in Europe on Nov. 13, 2010. The entire contents of these applications are hereby incorporated by reference in their entireties.

FIELD

The disclosure relates to a method and a system for intelligent visualization in the monitoring of process and/or system variables.

BACKGROUND INFORMATION

So-called mass data displays can represent a large number of standardized process variables in comparatively little monitor space. In large technical systems, for example, power plants, it is frequently not simply possible to specify which of the often many thousands of process and system variables can be important for a visualization. Therefore, the configuration and calibration of mass data displays can be supported by automated processes in order to be able to take the best possible advantage of the benefits of a clear and meaningful representation. Human perception of any kind of characters or patterns can react sensitively to their changes and deviations, as well as to irregularities.

This fact can be used for displays such as the display of so-called mass data, for example, a plurality of data on one display. During the undisturbed normal operation of a technical system or a technical process, it can be important that the display of the process parameters and the states of the system components, which also include the measuring points within the technical system, takes place as regularly as possible and changes as little as possible for human perception.

Nonetheless, given the surrounding circumstances of the process or the states of the system components and measuring points, because of noise, it may not be possible to avoid a certain level of disturbance and irregularities, even during normal operation of the system or the course of the process without any malfunctions or external influencing factors.

The greater the irregularity and disturbance due to noise, the less useful the display will be, for example, on a display of a monitor of the higher control level of an automation system.

Although the display of so-called mass data on a display can provide advantages due to the high level of abstraction, today, many system operators of larger technical systems such as power plants tend toward rendering real process and/or system parameters on the control room display.

These displays often include only relatively few process and/or system variables about the process and system states. For example, a maximum of several hundred of the most important values can be displayed on the system overview screens. The expense of monitoring them can increase relatively substantially with the amount of available process and/or system data. Since humans are able to monitor only a limited amount of data in parallel, the primary limitations can be the ability of system operators to absorb the information and the available monitor space. When malfunctions are retrospectively evaluated, it often turns out that in order to recognize a looming malfunction at an early stage, a specific process variable would have to have been displayed that had previously been considered relatively unimportant. Mass data displays can also make it possible to display a large amount of data in a systematic manner.

If one of the process and/or system values is subject to periodic fluctuations, this means that their representation will show corresponding variability. However, fluctuations are often not recognized as such by the system operator and are therefore often interpreted as misalignment. For example, rapid fluctuations of the system or process values can cause disturbance in the mass data display.

SUMMARY

A method is disclosed for the intelligent visualization in a monitoring of process and/or system data of a technical process or in an operation of a technical system, wherein a past behavior of a process and/or system data is analyzed and used for an optimized visualization, and wherein deviations from historically observed signal patterns are detected and correspondingly highlighted by continuously running online algorithms, the method comprising: combining a plurality of silent signals in a single view or representation form, wherein the process and/or system data that has not changed for a predefined past period of time is referred to as silent signals; performing a variance monitoring for an online monitoring of the silent signals; and in an event that an estimated variance of a process and/or system variable exceeds a preconfigured threshold value, a relevant signal is set "active," and the relevant signal is displayed in a highlighted manner and/or reported.

BRIEF DESCRIPTION OF THE DRAWINGS

In the following, exemplary embodiments will be described in greater detail by reference to the attached drawings, in which.

DETAILED DESCRIPTION

Figure 1:
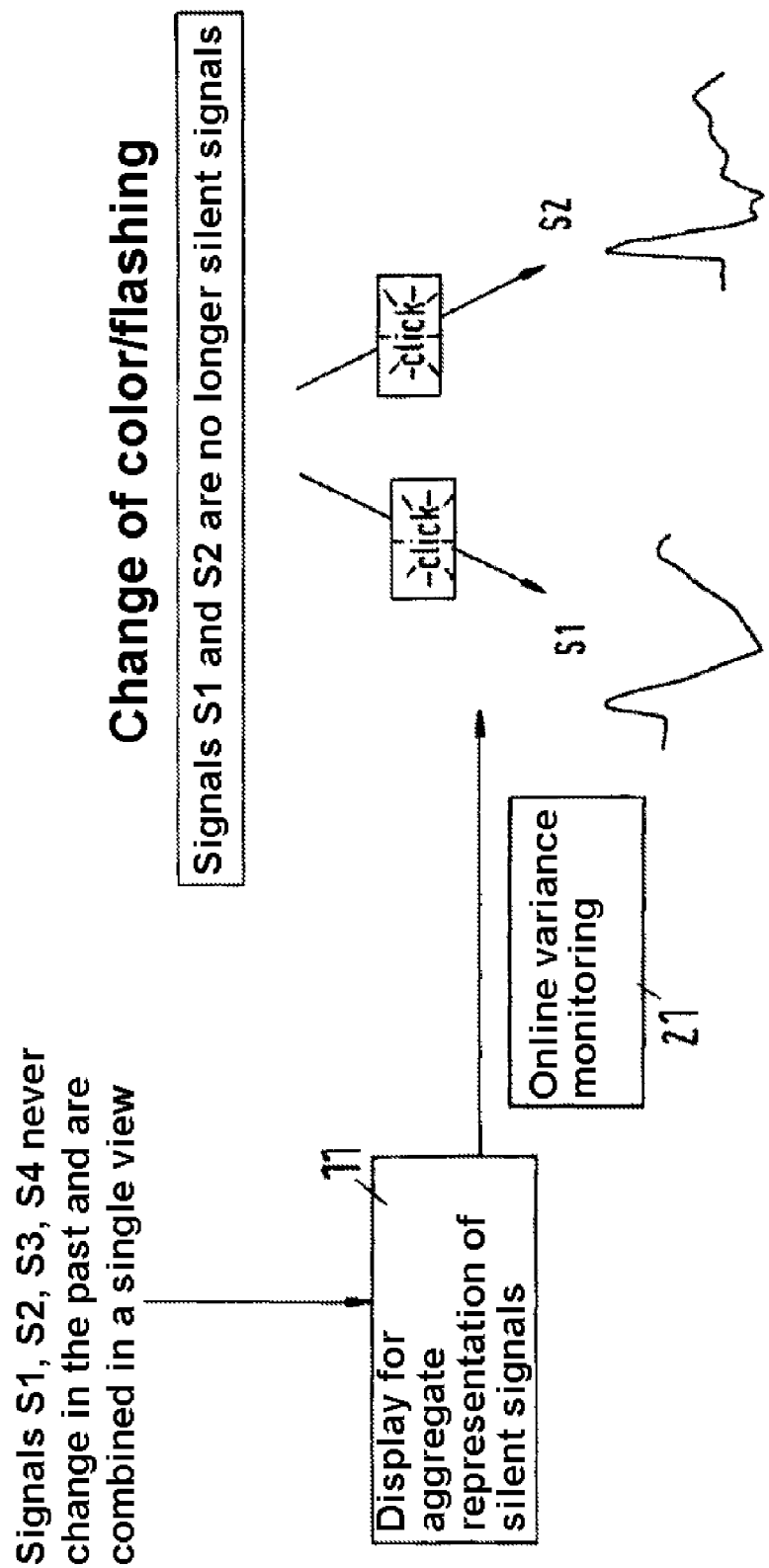
FIG. 1 shows an exemplary embodiment of an aggregate representation of silent signals in accordance with an exemplary embodiment.

The disclosure relates to a method and a system for intelligent visualization in the monitoring of process and/or system variables, for example, of so-called mass data, for example, a plurality of process and/or operating data, which appear during the operation of technical systems or during the course of technical processes. The disclosure can be suitable for the graphical representation of process data, for example, of mass data, on a display device, hereinafter also called a display, for example, in plant engineering, control and instrumentation, and process planning.

In accordance with an exemplary embodiment, the detected characteristics can be used to optimize the view or representation form for displaying the mass data. In accordance with an exemplary embodiment, a method for intelligent visualization in the monitoring of process and/or system variables, for example, so-called mass data is disclosed, which can limit the effort needed for calibration to a reasonable scale that is manageable for the system operator, wherein during normal operation, disturbance and irregularities in the display of the mass data can lie below the threshold value at which a display of the process and/or system variables becomes unusable.

In accordance with an exemplary embodiment, the behavior of the signals in the past can be analyzed and used for a visualization that can be optimized in the future. In accordance with an exemplary embodiment, continuously running online algorithms can support the system operator by detecting deviations from historically observed signal patterns and accordingly highlighting them.

For example, a rapid switch from a standardized abstract representation to a known rendering of the process and/or system variables or process and/or system data, such as a trend display, can be provided.

In accordance with exemplary embodiment, a method for the intelligent visualization in the monitoring of process and/or system data in a technical process or in the operation of a technical system is disclosed, wherein the behavior of the process and/or system data in the past can be analyzed and used for an optimized visualization, wherein deviations from historically observed signal patterns are detected and correspondingly highlighted by means (e.g., any available processor specially programmed as disclosed herein) for implementing continuously running online algorithms, by combining a plurality of silent signals in a single view or representation form, wherein process and/or system data that has not changed for a certain predefined period of time in the past is referred to as silent signals, variance monitoring for the online monitoring of the silent signals is performed, and in the event that an estimated variance of a process and/or system variable exceeds a preconfigured threshold value, the relevant signal is set "active," and this signal is displayed in a highlighted manner and/or reported.

According to the disclosure, it can be provided that for intelligent visualization in the monitoring of process and/or system data, for example, so-called mass data, which, for example, includes measured values, process variables, and/or state messages of a technical system or technical process, use can be made of the knowledge that much process and/or system data does not change for various reasons, and the assumption is thus valid that process and/or system data will not change in the future if it has not changed for at least for a certain period of time in the past, in which case a large number of these co-called silent signals are combined into a single view or representation form, such as a monitor display.

In accordance with an exemplary embodiment, an example of this is the degree of opening of a safety valve that is normally closed. For example, the normal operation of the system, this degree of opening, which can be always the same, can be irrelevant. However, if the valve opens due to extraordinary circumstances, this can be important information that should be explicitly represented to the system operator.

According to the disclosure, the silent signals, such as the closed valve in the previous example, can be monitored by means (e.g., processor) which implement suitable algorithms, and in the event that a signal becomes active, for example, the valve opens, this signal can be displayed in a highlighted manner on the display and/or reported.

In an exemplary embodiment of the disclosure, a signal can be regarded as "active" or set if an estimated variance of a process and/or system variable exceeds a preconfigured threshold value.

In an exemplary embodiment of the method according to the disclosure, a similarity metric can be defined and an algorithm can be used, for example, a correlation or principal component analysis (PCA) for evaluating the similarity metric for all process and/or system data.

In accordance with an exemplary embodiment, all process and/or system data that has been determined to be sufficiently similar can be displayed on a single display or in a single view, in which case it can be provided that the similarity metric is continuously evaluated on a regular basis by means of an evaluation module, and signals that no longer obey the similarity criteria can be automatically filtered out by means of a filter module and provided and/or displayed in a separate representation.

In an exemplary embodiment of the method according to the disclosure, the process and/or system data can be analyzed online with respect to dominant fluctuations by means of an analysis module so that, for example, detected dominant fluctuations can be removed from the signal and displayed separately.

The disclosure relates to a device or a system for intelligent visualization in the monitoring of process and/or system data, for example, mass data, which can be common in technical processes and in the operation of technical systems.

According to the disclosure, this display system or this display device can use a single view or representation form for intelligent visualization in the monitoring of the process and/or system data for representing a plurality of silent or standardized signals by means (e.g., a processor module for) highlighting, reporting, and/or displaying.

The monitoring of the signals by means of a monitoring module that can be integrated into the system is disclosed, wherein in the event of an active signal, this signal can be detected by the monitoring module and can be transmitted to and/or represented on a view of the display there.

In an exemplary embodiment of the system according to the disclosure, a threshold value monitoring module can be provided that selects an active signal if an estimated variance of the relevant process and/or system data exceeds a preconfigured threshold value.

According to an exemplary embodiment of the disclosure, the system can include the creation of a similarity metric and its evaluation can be carried out for all process and/or system variables by means for performing a predetermined algorithm, and/or all signals that no longer obey the similarity criteria are automatically displayed or reported in an aggregate representation.

According to an exemplary method, it can be also provided in the system according to the disclosure that all mass data that has been determined to be sufficiently similar can be displayed on a single display.

According to the disclosure, existing historical process data, for example, from a plant information management system (PIMS), can be evaluated during the preliminary offline engineering phase.

If, for example, in a newly constructed system, little historical process data is currently available, the described displays thus cannot initially function at the highest level of quality. As soon as sufficient historical process data is available at a later time, calibration of the displays can be carried out again.

FIG. 1 shows an exemplary embodiment of an aggregate representation of silent signals S1, S2, S3, S4. The starting point can be the view of a total quantity of measured process and/or system variables, wherein many process and/or system variables do not change for various reasons. For example, these variables can relate to components that always work identically in normal system operation, such as pressure relief valves. However, for the configuration of mass data displays, measurements taken with defective sensors are also relevant. For example, if the respective process and/or system variables, which are subsequently also referred to as silent signals S1, S2, S3, S4, have not changed for a certain previously defined period of time in the past, it is probable that they also will not change in the future. However, if such a signal changes, this fact can be of importance to the system operator in many cases.

A large number of silent signals S1, S2, S3, S4 can thus be combined in a single view (display) or representation form 11.

According to the disclosure, the silent signals S1, S2, S3, S4 can be monitored by means of a monitoring module 21, which can be integrated into the display system belonging to the aggregate representation and which performs variance monitoring, and if a signal S1, S2 becomes active, for example, because the estimated variance exceeds a preconfigured threshold value, then this fact can be shown in the display, for example, by a change in color of the displayed signal. The monitoring module for performing variance monitoring 21 can thus be used continuously for performing online monitoring.

Figure 2:
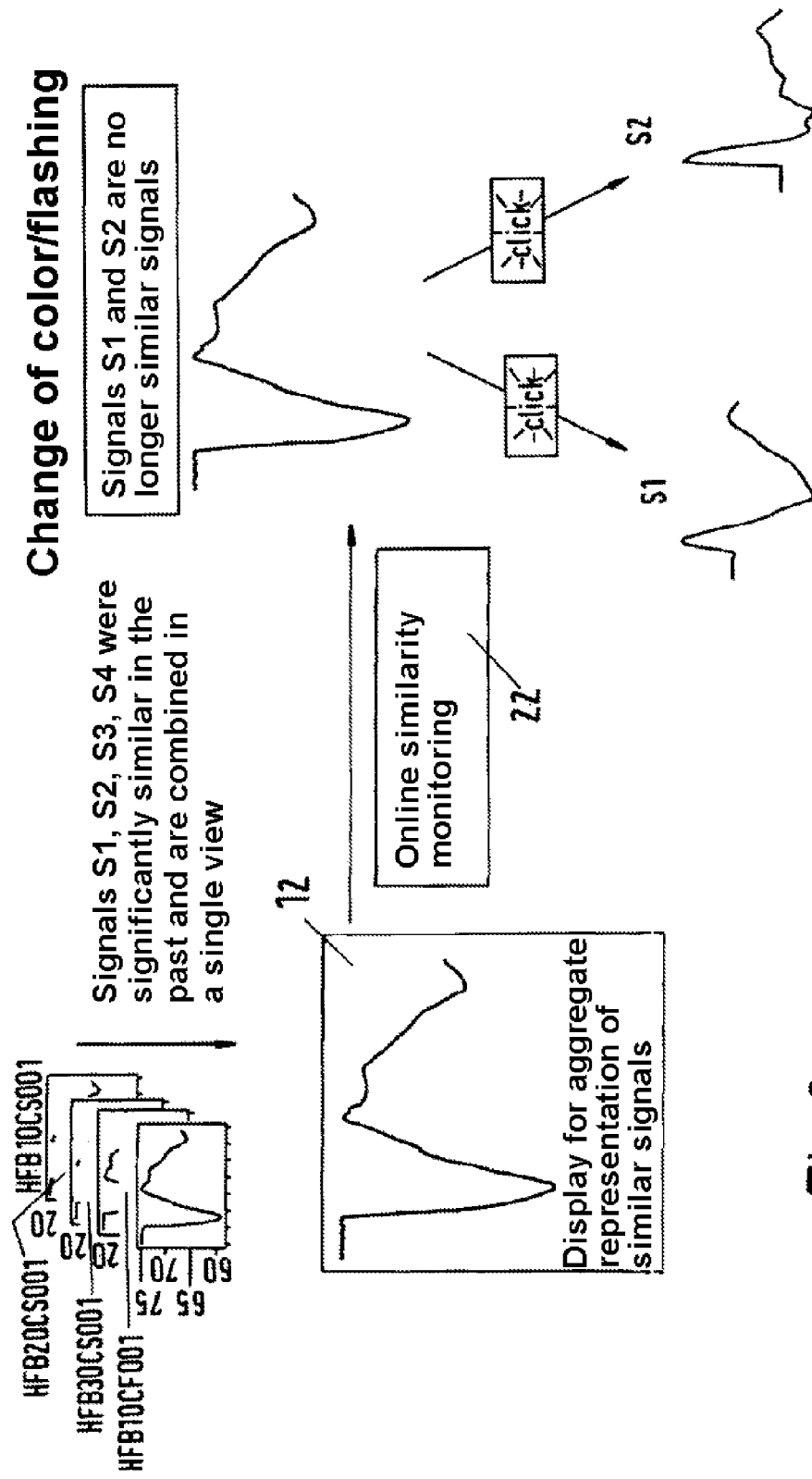
FIG. 2 shows an exemplary embodiment of an aggregate representation of similar signals in accordance with an exemplary embodiment.

FIG. 2 shows an exemplary embodiment of an aggregate representation of similar signals S1, S2, S3, S4. Many process and/or system variables behave similarly, for example, when redundant measuring points exist. As long as the measured values at the redundant measuring points behave identically, for example, show no deviations from each other, there can be little reason to show all measured values. Thus, in a first step, a similarity metric is defined and an appropriate algorithm, such as correlation or principal component analysis (PCA), can be used for evaluating this metric on all relevant process and/or system variables.

In accordance with an exemplary embodiment, process and/or system variables or process and/or system signals S1, S2, S3, S4 that have been determined to be sufficiently similar can then be displayed on a single display 12. This similarity metric can be regularly evaluated by means of a provided evaluation module 22, and signals S1, S2, which no longer meet the similarity criteria, can be automatically indicated, for example, by a change in color. The evaluation module 22 works, as previously described for the monitoring module 21, as an online similarity monitoring module.

Figure 3:
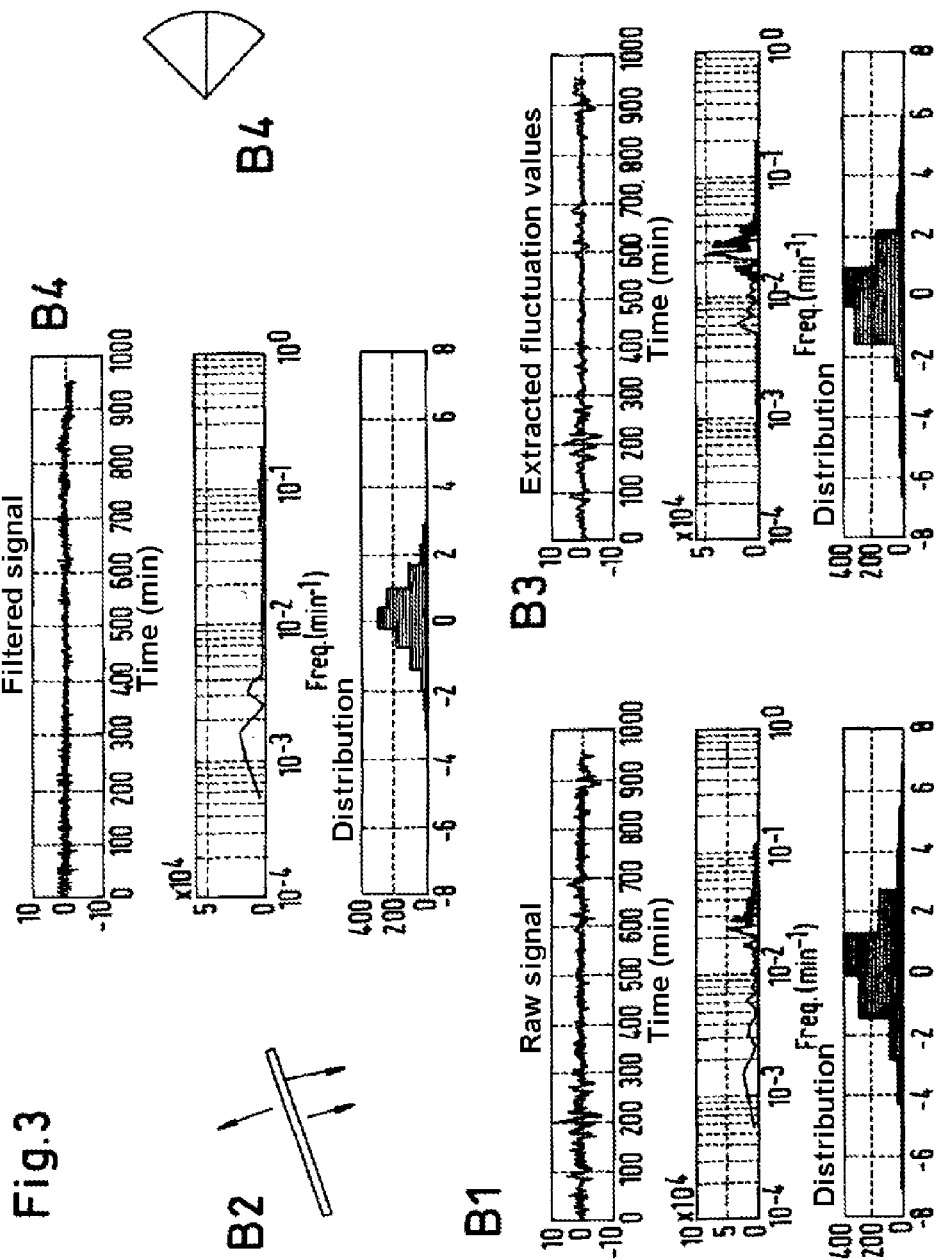
FIG. 3 shows an exemplary embodiment of an exemplary detailed fluctuation display.

FIG. 3 shows an exemplary embodiment of a detailed fluctuation display, wherein the process and/or systems signals can be analyzed online for dominant fluctuations by means of an analysis module such that the previously detected dominant fluctuations can be subtracted from the corresponding signals and displayed separately. The remaining signal components may move less since they have less variability. The representation can therefore help to show more regular and stable patterns. For example, the explicit representation of fluctuations can help the system operator recognize even a slow fluctuation.

FIG. 3 shows signal waveforms for an unfiltered raw signal B1, for a signal B3 having the portion of the dominant fluctuations, and for a signal B4, as well as a mass data display B2.

The unfiltered raw signal B1 can have strong variability, which can cause a strong disturbance in the mass data display B2. The signal B3 shows the portion of the dominant fluctuations, which can be contained in the raw signal B1. These fluctuations can be removed from the raw signal B1 and thus bring about the signal waveform B4, which can also be referred to as a filtered signal. In accordance with an exemplary embodiment, the signal B4 has significantly lower variability; such that the mass data display element behaves significantly more steadily. The fluctuation of signal B3 can be visualized in the mass data display by showing a sector that opens more widely as the fluctuation increases. For example, instead of a line that moves sharply back and forth as shown as B2, the sector B4 moves only slightly. This creates a steadier image, and the fluctuations can be made explicitly visible by the sector B4.

Figure 4:
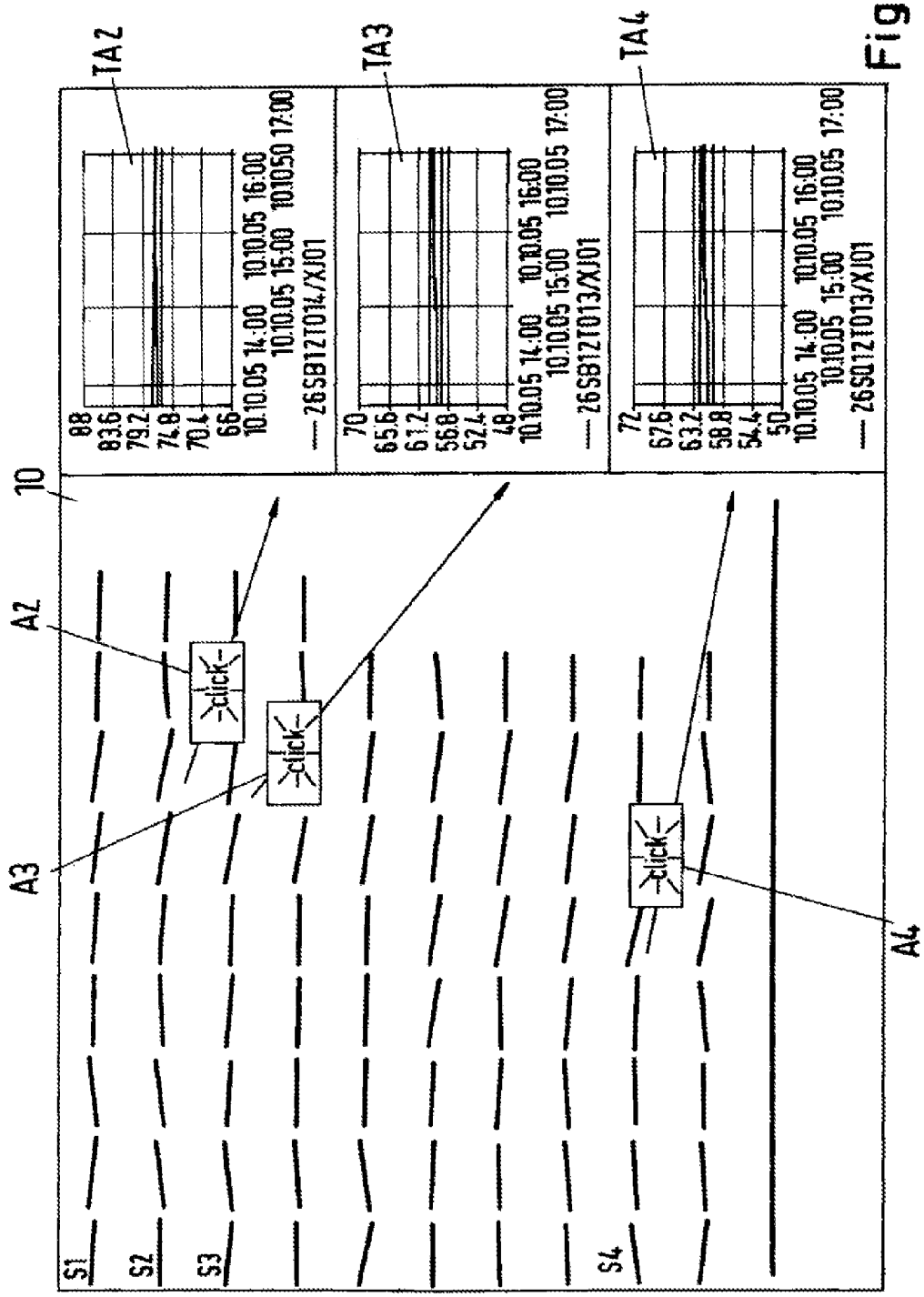
FIG. 4 shows an exemplary embodiment of a representation of mass data on a display of a monitor of a higher control level of an automation system.

FIG. 4 shows an exemplary embodiment according to the disclosure of mass data 10 on a display of a monitor of the higher control level of an automation system, wherein the signals S1, S2, S3, S4 . . . can be standardized and abstracted, which allows showing large numbers of signals and using human skills for comparing patterns. As soon as a deviation from the normal signal A2, A3, A4 is displayed within the represented signal S2, S3, S4 within the context of fault detection, the system operator of the automation system can analyze the reason for this deviation A2, A3, A4. For the latter, the operator can analyze the respective process and/or system variables. Therefore, making a rapid connection between the abstract representation of mass data 10 within the context of fault detection and a standard trend display as a fault diagnostic is desirable.

According to the disclosure, a plurality of trend displays TA2, TA3, TA4 is placed around the mass data representation 10 for this purpose. For example, it can be relatively easy to select an element A2, A3, A4 from the mass data representation 10 and represent the related process variable in one of the trend displays TA2, TA3, TA4.

In accordance with an exemplary embodiment, the described technology allows configuring displays systematically in such a way that they can provide a full overview of the process and simultaneously keep the amount of displayed process and/or system data as low as possible. For example, disturbance and irregularities in the display can be minimized during normal operation. System operators can be relieved of tedious tasks such as judging whether a signal is still silent or is still similar enough in comparison to other signals. Fluctuations in the process and/or system variables can be made explicitly visible without relevantly influencing the visible patterns in the overall representation when representing mass data. The connection between fault detection, supported by an abstract and standardized representation, and fault diagnostics, supported by standard trend displays, can be achieved by a new combination of an abstract/standardized display of the mass data and the standard trend displays of individual process and/or system variables.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for the intelligent visualization in a monitoring of process and/or system data of a technical process or in an operation of a technical system, wherein a past behavior of a process and/or system data is analyzed and used for an optimized visualization, and wherein deviations from historically observed signal patterns are detected and correspondingly highlighted by continuously running online algorithms, the method comprising:
  identifying silent signals by finding those of the process and/or system data that have not changed for a predefined past period of time;
  combining a plurality of these silent signals in a single view or representation form that does not include any signals not identified as silent signals;
  performing a variance monitoring of the process and/or system data corresponding to the silent signals;
  determining an estimated variance of each of the silent signals of the process and/or system data;
  in an event that the estimated variance of one of the silent signals exceeds a preconfigured threshold value, setting the corresponding silent signal from the plurality of combined silent signals "active"; and
  displaying the corresponding "active" silent signal in a highlighted manner and/or reporting it.

2. The method as claimed in claim 1, wherein the process and/or system data comprises mass data.

3. The method as claimed in claim 2, wherein the mass data is a plurality of process and/or operating data.

4. The method as claimed in claim 1, comprising:
  defining a similarity metric;
  evaluating the similarity metric for all process and/or system data with an algorithm; and
  displaying as combined in a single view, the process and/or system data that has been determined to be sufficiently similar in the past.

5. The method as claimed in claim 4, comprising:
  regularly monitoring and evaluating online by an evaluation module, the similarity metric; and
  automatically providing and/or displaying in a separate representation, signals that no longer meet a similarity criteria.

6. The method as claimed in claim 1, comprising:
  analyzing online with respect to dominant fluctuations by an analysis module unfiltered raw signals of the process and/or system data.

7. The method as claimed in claim 6, comprising:
  subtracting detected dominant fluctuations from the signal; and
  separately displaying the detected dominant fluctuations.

8. The method as claimed in claim 1, wherein the process and/or system data comprises:
  measured values, process variables, and/or state messages of the technical system or the technical process.

9. A system for the intelligent visualization in a monitoring of process and/or system data, the system comprising:
  a technical process or technical system;
  a processor configured to:
    analyze a past behavior of a process and/or system data and used for an optimized visualization, and wherein deviations from historically observed signal patterns are detected and correspondingly highlighted by continuously running online algorithms;
    identify silent signals by finding those of the process and/or system data that have not changed for a predefined past period of time;
    combine a plurality of these silent signals in a single view or representation form that does not include any signals not identified as silent signals;
    perform a variance monitoring of the process and/or system data corresponding to the silent signals;
    determine an estimated variance of each of the silent signals of the process and/or system data; and
    in an event that the estimated variance of one of the silent signals exceeds a preconfigured threshold value, set the corresponding silent signal from the plurality of combined silent signals "active"; and
  a display configured show the corresponding "active" silent signal in a highlighted manner.

10. The system as claimed in claim 9, wherein the process and/or system data comprises mass data.

11. The system as claimed in claim 10, wherein the mass data is a plurality of process and/or operating data.

12. The system as claimed in claim 9, comprising:
  defining a similarity metric;
  evaluating the similarity metric for all process and/or system data with an algorithm; and
  displaying as combined in a single view, the process and/or system data that has been determined to be sufficiently similar in the past.

13. The system as claimed in claim 12, comprising:
  regularly monitoring and evaluating online by an evaluation module, the similarity metric; and
  wherein signals that no longer meet a similarity criteria are automatically provided and/or displayed in a separate representation.

14. The system as claimed in claim 9, comprising:
  analyzing online with respect to dominant fluctuations by an analysis module unfiltered raw signals of the process and/or system data.

15. The system as claimed in claim 14, wherein detected dominant fluctuations are subtracted from the signal and displayed separately.

16. The system as claimed in claim 9, wherein the process and/or system data comprises:
  measured values, process variables, and/or state messages of the technical system or the technical process.

17. A method for the intelligent visualization in a monitoring of process and/or system data of a technical process or in an operation of a technical system, the method comprising:
  analyzing a past behavior of a process and/or system data and used for an optimized visualization, and wherein deviations from historically observed signal patterns are detected and correspondingly highlighted by continuously running online algorithms;
  identifying silent signals by finding those of the process and/or system data that have not changed for a predefined past period of time;
  combining a plurality of these silent signals in a single view or representation form that does not include any signals not identified as silent signals;
  performing a variance monitoring of the process and/or system data corresponding to the silent signals;
  determining an estimated variance of each of the silent signals of the process and/or system data;
  in an event that the estimated variance of one of the silent signals exceeds a preconfigured threshold value, setting the corresponding silent signal from the plurality of combined silent signals "active"; and
  displaying the corresponding "active" silent signal in a highlighted manner.

* * * * *